(12) United States Patent
Carbone et al.

(10) Patent No.: US 12,733,126 B2
(45) Date of Patent: Sep. 8, 2026

(54) HEAT SINK FILLER FOR MATCHED IMPEDANCE OF AIR FLOW

(71) Applicant: International Business Machines Corporation, Armonk, NY (US)

(72) Inventors: Cara Carbone, Poughkeepsie, NY (US); Khaalid Persaud Juggan McMillan, Haverstraw, NY (US); Robert R. Genest, Poughkeepsie, NY (US); Felipe Andres Valenzuela Gaete, Poughkeepsie, NY (US); Shawn Deutchman, Poughkeepsie, NY (US); John Torok, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 109 days.

(21) Appl. No.: 18/600,831

(22) Filed: Mar. 11, 2024

(65) Prior Publication Data

US 2025/0287524 A1 Sep. 11, 2025

(51) Int. Cl.
*H05K 7/20* (2006.01)

(52) U.S. Cl.
CPC ..... *H05K 7/20145* (2013.01); *H05K 7/20154* (2013.01); *H05K 7/20736* (2013.01)

(58) Field of Classification Search
CPC ........... H05K 7/20145; H05K 7/20181; H05K 7/20736; F28D 2021/0028; F28F 2280/02
See application file for complete search history.

(56) References Cited

U.S. PATENT DOCUMENTS 6,343,013 B1 * 1/2002 Chen .................. H01L 23/4093 174/16.3
6,393,853 B1 5/2002 Vukovic
6,758,692 B2 * 7/2004 Walkup ............... H01L 23/4093 439/928.1
6,927,976 B1 8/2005 Malone
7,077,893 B2 * 7/2006 Guilliard ............ H05K 7/20181 96/414
7,215,552 B2 5/2007 Shipley
7,262,964 B1 * 8/2007 Barsun ............... H05K 7/20154 174/16.3
7,474,528 B1 1/2009 Olesiewicz
7,551,446 B2 6/2009 Handley
(Continued)

FOREIGN PATENT DOCUMENTS

EP 1827070 B1 10/2017
JP 05335454 A 12/1993
WO 2023091980 A1 5/2023

OTHER PUBLICATIONS

Miraglia, Christian, "Fundamentals of Heat Transfer in Thermal Interface Gap Filler Materials", Fujipoly, provided by Searcher on Dec. 21, 2023, 4 pages, >https://www.fujipoly.com/usa/assets/files/Fundamentals%20of%20Heat%20Transfer%20in%20TIMS.pdf>.

*Primary Examiner* — Nelson J Nieves
(74) *Attorney, Agent, or Firm* — Teddi Maranzano

(57) ABSTRACT

A heat sink filler to maintain proper cooling air flow through operating processing units is disclosed. The heat sink filler comprises a frame with a removable perforated sheet inside the frame, wherein the perforated sheet is configured to match an impedance of a heat sink. The heat sink filler further includes a first keying feature. The heat sink filler also includes an extended edge on a first edge of the frame and a beveled edge on the second edge of the frame.

11 Claims, 10 Drawing Sheets

(56) References Cited

U.S. PATENT DOCUMENTS

| | | | | |
|---|---|---|---|---|
| 7,589,971 | B2 | 9/2009 | Gordon | |
| 7,595,982 | B2 | 9/2009 | Ong | |
| 7,808,792 | B2 | 10/2010 | Nguyen | |
| 8,164,897 | B2 | 4/2012 | Graybill | |
| 9,377,828 | B2 | 6/2016 | Tunks | |
| 9,696,769 | B1 * | 7/2017 | Hamilton | H05K 5/03 |
| 9,883,610 | B1 * | 1/2018 | Beall | G11B 33/14 |
| 10,326,258 | B2 * | 6/2019 | Dall'Agnol | H02B 1/56 |
| 10,488,892 | B1 | 11/2019 | Lin | |
| 11,385,002 | B2 | 7/2022 | Mcmillan | |
| 12,320,362 | B2 * | 6/2025 | Yeh | F04D 25/14 |
| 12,457,691 | B2 * | 10/2025 | Savage | H05K 1/0203 |
| 2006/0067046 | A1 | 3/2006 | Dey | |
| 2009/0046430 | A1 | 2/2009 | Brewer | |
| 2015/0015130 | A1 * | 1/2015 | Lu | H05K 5/15<br>312/265.5 |
| 2016/0262286 | A1 | 9/2016 | Lin | |
| 2017/0147044 | A1 | 5/2017 | Slaton | |
| 2018/0070473 | A1 * | 3/2018 | Zhang | G06F 1/181 |
| 2019/0098797 | A1 * | 3/2019 | Avalos Garcia | H05K 7/20727 |
| 2023/0422426 | A1 * | 12/2023 | Chen | H05K 5/03 |
| 2024/0001272 | A1 * | 1/2024 | Song | H05K 7/20909 |
| 2024/0023236 | A1 * | 1/2024 | Curtis | H05K 7/20145 |
| 2024/0392795 | A1 * | 11/2024 | Yeh | F04D 25/14 |
| 2024/0397661 | A1 * | 11/2024 | Yeh | H05K 7/20145 |
| 2025/0142763 | A1 * | 5/2025 | Yow | H05K 7/20736 |

* cited by examiner 120
220
202
226
125

HEAT SINK FILLER FOR MATCHED IMPEDANCE OF AIR FLOW

BACKGROUND

The present disclosure relates to multi core computing, and, more specifically, a heat sink filler to maintain cooling flow though heat sinks.

Many modern computing systems contain multiple processing units in a drawer. These processing units generate enough heat to require external cooling from air and/or water cooling systems.

SUMMARY

Disclosed is a heat sink filler. The heat sink filler comprises a frame with a removable perforated sheet inside the frame, wherein the perforated sheet is configured to match an impedance of a heat sink. The heat sink filler further includes a first keying feature. The heat sink filler also includes an extended edge on a first edge of the frame and a beveled edge on the second edge of the frame.

Also disclosed is method for replacing a heat sink with a heat sink filler. The method includes removing a first processing unit and an associated heat sink from a drawer. The method also includes removing a first processing unit and an associated heat sink from a drawer. The method further includes determining an impedance of air flow through the heat sink. The method includes creating a perforated sheet to match the impedance of air flow through the perforated sheet. The method further includes inserting the perforated sheet into a heat sink filler and installing the heat sink filler into the drawer. The method also includes initiating air flow through the drawer.

Further disclosed is a system for maintaining air flow through a drawer. The system includes a server drawer with two or more module openings, with at least a first processing unit in one opening and a first heat sink in another opening. The heat sink further comprises a frame and a removable perforated sheet inside the frame, wherein the perforated sheet is configured to match an impedance of the first heat sink.

The present Summary is not intended to illustrate each aspect of, every implementation of, and/or every embodiment of the present disclosure.

BRIEF DESCRIPTION OF THE DRAWINGS

Various embodiments are described herein with reference to different subject-matter. In particular, some embodiments may be described with reference to methods, whereas other embodiments may be described with reference to apparatuses and systems. However, a person skilled in the art will gather from the above and the following description that, unless otherwise notified, in addition to any combination of features belonging to one type of subject-matter, also any combination between features relating to different subject-matter, in particular, between features of the methods, and features of the apparatuses and systems, are considered as to be disclosed within this document.

The aspects defined above, and further aspects disclosed herein, are apparent from the examples of one or more embodiments to be described hereinafter and are explained with reference to the examples of the one or more embodiments, but to which the invention is not limited. Various embodiments are described, by way of example only, and with reference to the following drawings.

DETAILED DESCRIPTION

Figure 1:
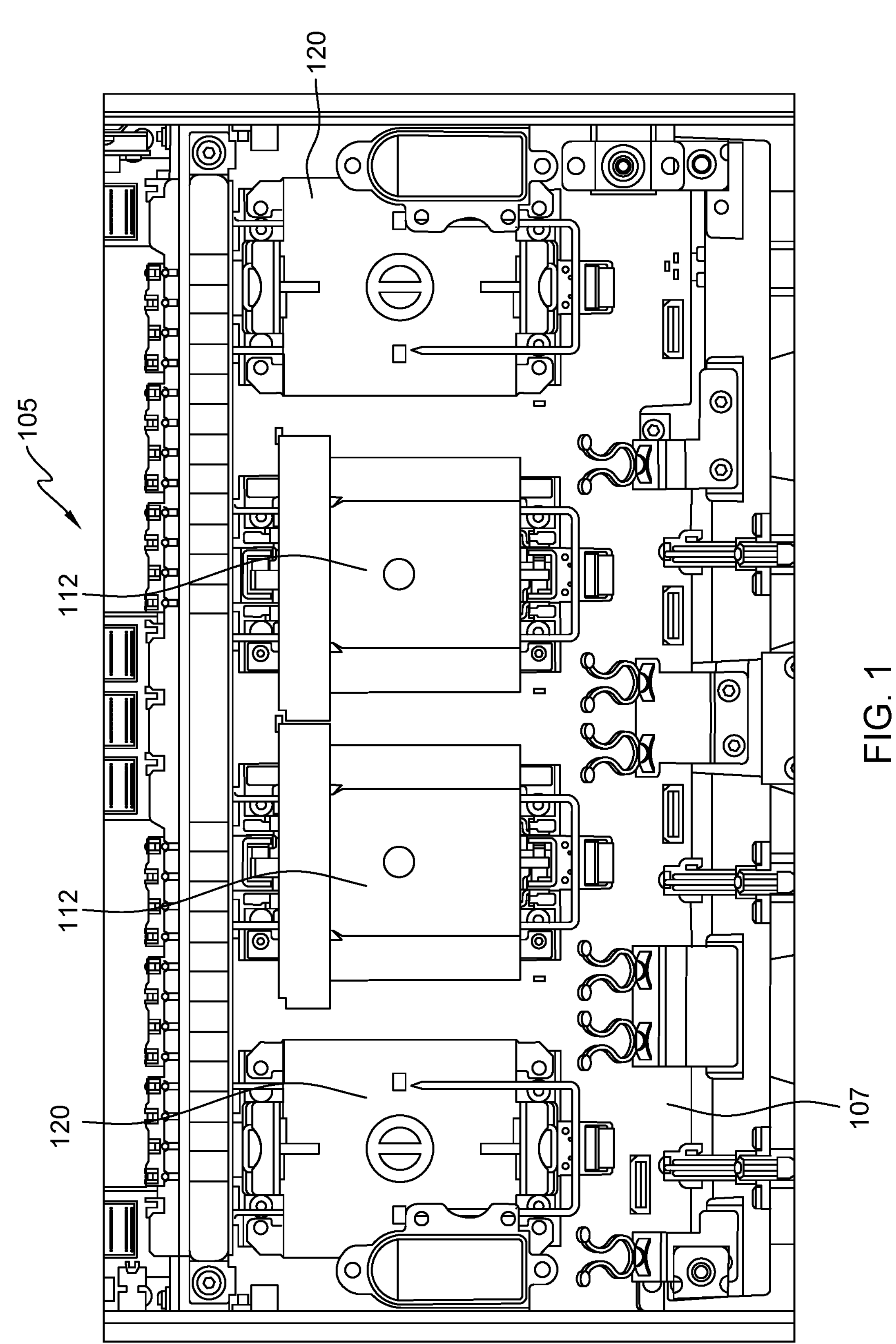
FIG. 1 is a top-down view of a server drawer in accordance with some embodiments of the present disclosure.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

Many modern computing systems contain multiple processing units in a drawer. These processing units generate enough heat to require external cooling from air and/or water cooling systems.

In some embodiments, the processing units are associated with a heatsink. The heatsink and processing units can be considered a single unit, and/or two separate but complimentary components. The heatsink is configured to assist in transferring heat from the processing unit to air passing through the drawer or other cooling apparatus, away from the processing unit. In some embodiments, the heat sink is designed to operate when all units in a drawer contain an operating processing unit with an attached heat sink. However, in various situations, one or more of the processing units are removed. The number of processing units installed and/or operating can be based on the needs of the operators.

In some embodiments, when a heat sink and/or processing unit is not present, the empty space vacated, by where the heat sink was located or could be located, provides an easier path for air flow through the drawer. If more cooling flow is traveling through the empty space, then less is traveling through the remaining heat sinks. This can result in the temperature of the operating processing units to increase. As a result, additional cooling and/or load reduction may be needed to prevent overheating and damage to the processors and other components.

Embodiments of the present disclosure help to maintain proper cooling air flow through the heatsinks, even when one or more heatsinks are removed. Embodiments of the present disclosure include a heat sink filler. The heat sink filler fills the empty space to prevent excess air flow around the remaining heat sinks. In some embodiments, the heat sink filler includes a perforated sheet that sits within the heat sink filler. The perforated sheet can be configured to have the same or similar impedance to the heat sink. Similar impedance makes the pressure drop and flow rate across the heat sink filler relatively similar to if the same flow as passing through a heat sink. Thus, the system will maintain cooling flow and heat transfer within the normal parameters. This can increase the overall efficiency of the drawer and reduce costs and maintenance associated with excess cooling.

In some embodiments, the edges of the heat sink filler include edges configured to engage (touch, interlock) the adjacent component or side of the drawer. The adjacent component can be another heat sink filler or a heat sink. In some embodiments, one edge has an extended portion for the entire height of the heat sink filler, and the second edge has a beveled edge (or recessed edge), where the edge is the side that is in contact or near contact with adjacent components. The extended/beveled edges prevent any significant air flow around the heat sink and/or heat sink fillers, causing essentially all of the air to pass through the components as designed.

In some embodiments, the heat sink filler is configured to interlock with a dust cover. The dust cover sits in the drawer to prevent contamination of computing components. When a processing unit is removed, a dust cover replaces the location on the bottom of the drawer. In some embodiments, the heat sink filler can sit on top of the dust cover. In some embodiments, the heat sink filler includes keying features. The keying features ensure the heat sink filler can connect to the dust cover in one orientation.

The aforementioned advantages are example advantages, and embodiments exist that can contain all, some, or none of the aforementioned advantages while remaining within the spirit and scope of the present disclosure.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" if the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the depicted structure(s) as oriented. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The terms "about," "substantially," "approximately," and variations thereof, are intended to include the degree of error associated with measurement of the particular quantity based upon the equipment available at the time of filing the application. For example, substantial coplanarity between various materials can include an appropriate manufacturing tolerance of ±8%, ±5%, ±2%, or the like, difference between the coplanar materials.

As used herein, the term "coplanar" refers to two surfaces that lie in a common plane. In other words, two surfaces are coplanar if there exists a geometric plane that contains the points of both of the surfaces. Accordingly, two surfaces may be referred to as substantially coplanar despite deviations from coplanarity, so long as those deviations do not impact the desired result of the coplanarity.

As used herein, the terms "selective" or "selectively" in reference to a material removal or etch process denote that the rate of material removal for a first material is greater than the rate of removal for at least another material of the structure to which the material removal process is applied. For example, in certain embodiments, a selective etch may include an etch chemistry that removes a first material selectively to a second material by a ratio of 2:1 or greater, e.g., 5:1, 10:1 or 20:1.

Referring now to various embodiments of the disclosure in more detail, FIG. 1 is one embodiment of a top-down view of a drawer 105. Drawer 105 can be from a server, high performance computer, and/or any other computing system. FIG. 1 includes drawer 105, drawer base 107, heat sink 112, dust cover 120, and a plurality of additional non-identified components. Drawer base 107 has four openings for modules. However, in various embodiments, drawers can be configured to hold any number of modules. The modules can be a processing unit, heat sink, a heat sink filler, a dust cover, and/or any combination of the foregoing. Drawer base 107 shows two heat sinks 112 and two dust covers 120.

In some embodiments, heat sink 112 is configured to allow for the removal of heat from the processing unit into the heat sink 112. Each heat sink 112 sits on top of a processing unit that generates heat during operation. Heat sink 112 can be configured to allow cooling air flow to pass through heat sink 112, and transfer heat from the processing unit to the cooling air flow.

Dust cover 120 can be configured to cover the module opening. Dust cover 120 can be designed to fit into the module opening in the same manner as the processing unit. When a processing unit is removed, dust cover 120 can be installed to prevent dust and other debris from contaminating other components that would interface with the processing unit (e.g., plugs, switched, etc.).

As shown, cooling air passing through drawer 105 can bypass heat sink 112 and travel through the open space above dust cover 120. This causes smaller amount of air to pass through heat sink 112 and reduces cooling of the associated processing unit. As a result, the processing unit may be operating at higher temperatures which can shorten the life of the components, require increase cooling air flow with their associated costs, and potentially reduce a workload of the processing unit (e.g., temperature-based throttling).

Figure 2B:
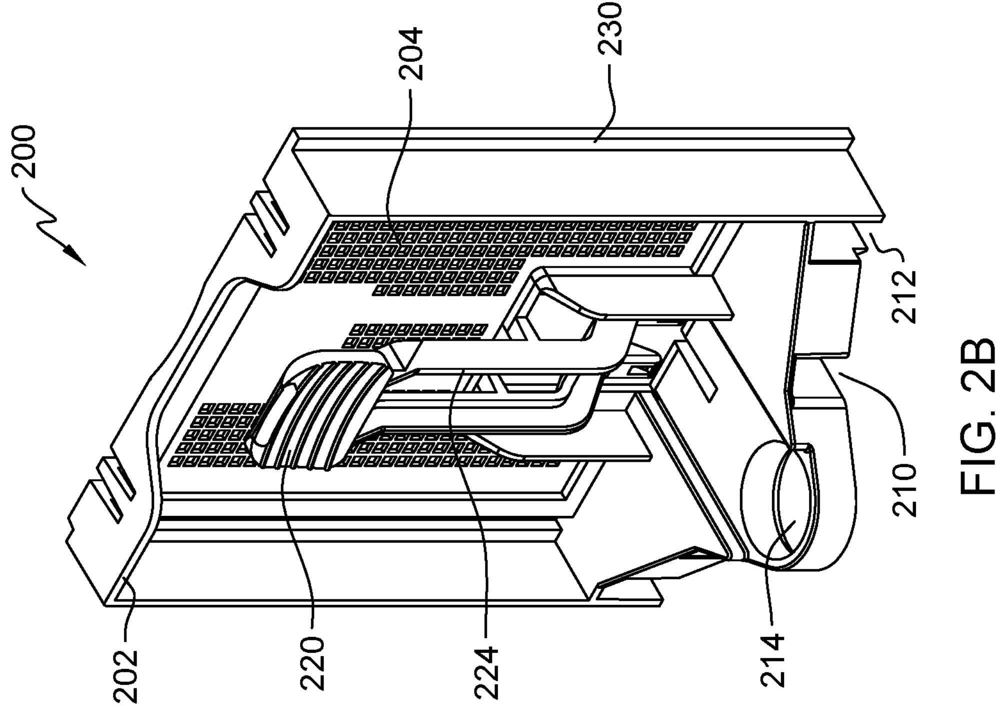
FIGS. 2A-2C are various views of a heat sink filler in accordance with some embodiments of the present disclosure.
Figure 2A:
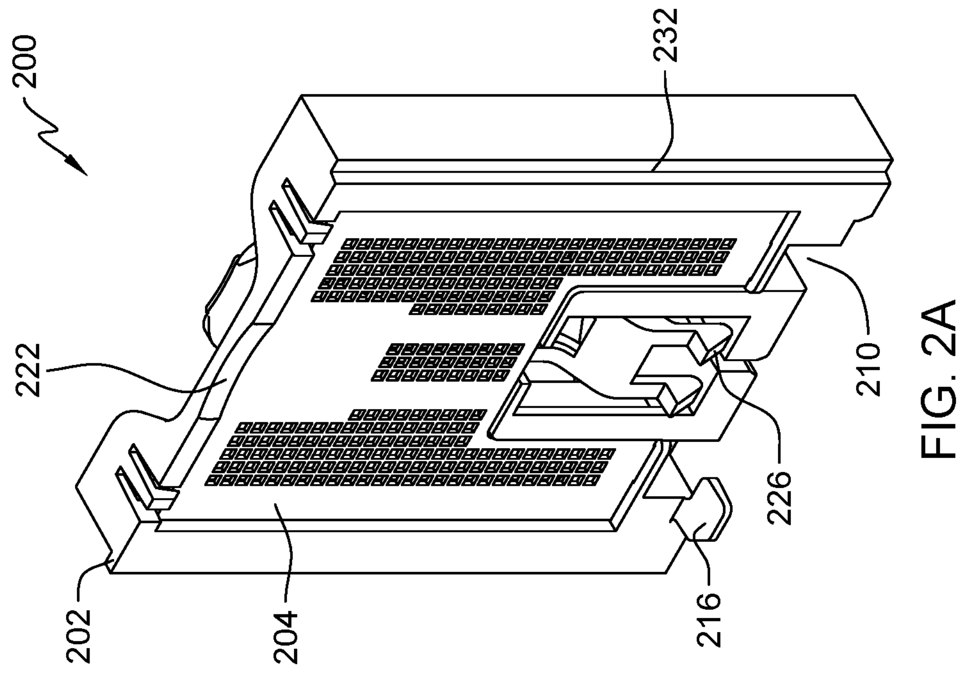

FIGS. 2A and 2B show views of a heat sink filler 200. FIG. 2A and FIG. 2B show a front and back view of heat sink filler 200. Heat sink filler 200 comprises frame 202. Frame 202 is configured to imitate a profile of heat sink 112. In some embodiments, frame 202 can be metal, plastic, and/or any other suitable material. Frame 202 can have an open center configured to hold perforated sheet 204.

Figure 2C:
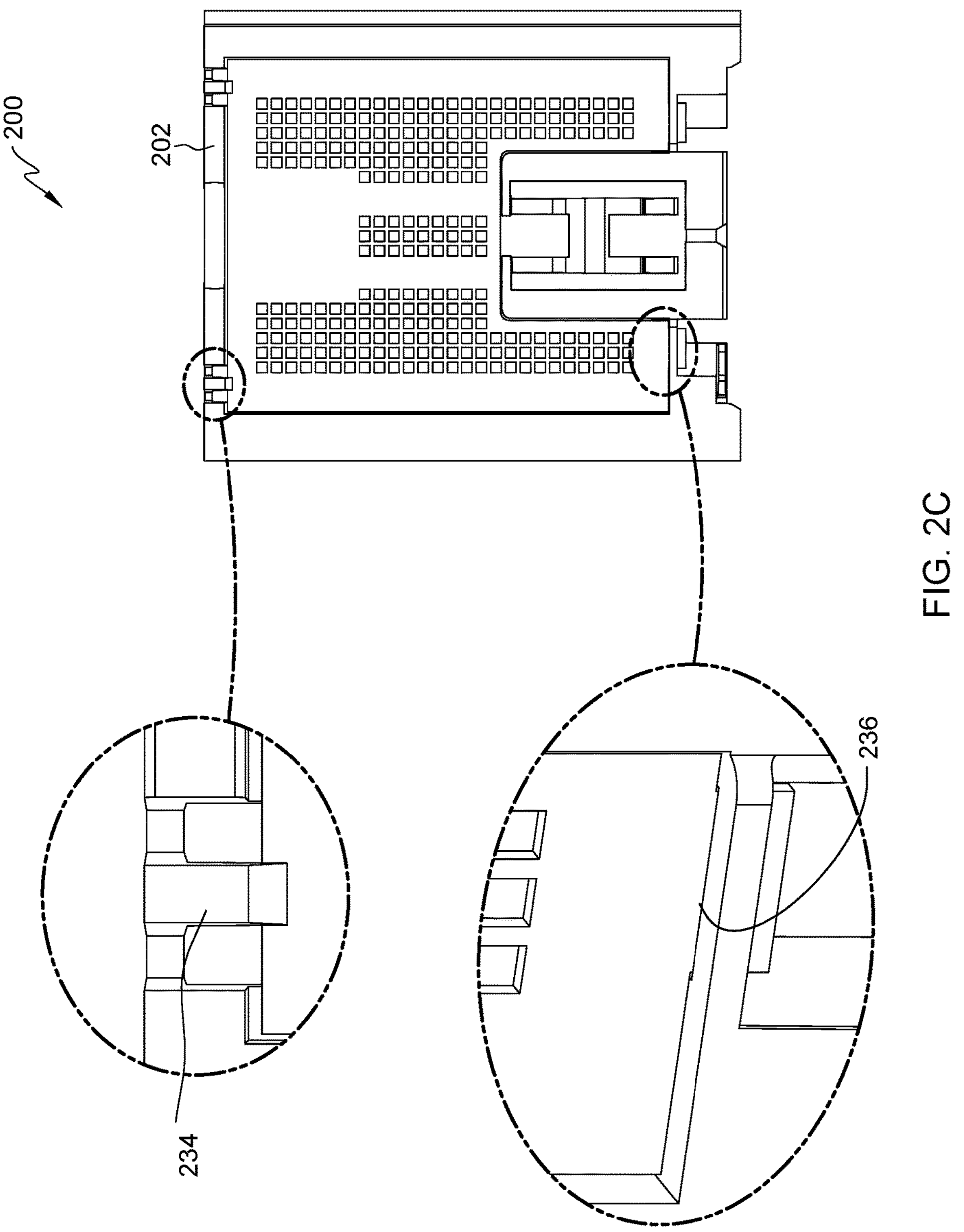

In some embodiments, perforated sheet 204 can be inserted into frame 202. In some embodiments, perforated sheet 204 can have any number of holes/openings. The size, shape, and distribution of openings can be configured to change the impedance of air flow through the perforated sheet 204. In some embodiments, perforated sheet 204 can be interchangeable. When two or more heat sink fillers 200 are being used in drawer 105, the two separate perforated sheets 204 in either heat sink filler 200 can have the same or different distribution of openings. FIG. 2C shows an expanded view of the top and bottom of perforated sheet 204 and the interaction with frame 202. In some embodiments, upper tab 234 can be any clip configured to hold perforated sheet 204 in place against frame 202. Upper tab 234 can move to release/replace perforates sheet 204. Lower slot 236 is a slot in frame 202. The slot can be correlated with a tab on perforate sheet 204. Lower slot 236 can be configured to hold the base of perforated sheet 204 in place. In some embodiments, when inserted, perforated sheet 204 forms a nearly planar structure on the front side (inlet side) of heat sink filler 200.

Frame 202 includes wire bail channel 210. Wire bail channel 210 is an opening on the side of frame 202 that is in contact with dust cover 120. The wire bail assists in holding dust cover 120 and/or heat sink 112 and its associated processing unit in place on drawer base 107. In some embodiments, frame 202 includes one or more keying features. Keying feature 212 is on the edge of frame 202 extends lower than the remaining base of frame 202. The extended portions of keying feature 212 is correlated with the edge of dust cover 120. Keying feature 214 is an opening in heat sink filler 200. Keying feature 214 is configured to surround a correlated keying feature on dust cover 120. Keying feature 212 and keying feature 214 work together to ensure frame 202 is correctly situated on dust cover 120. Keying feature 216 is asymmetrical. The asymmetry ensures heat sink filler 200 is inserted in the correct orientation.

In some embodiments, heat sink filler 200 includes release lever 220 as shown in FIG. 2B. Pressure point 222, as shown in FIG. 2A, is on the opposite side of heat sink filler 200 relative to release lever 220. In some embodiments, release lever 220 and pressure point 222 can be marked in a different manner. The marking indicates where a technician should touch heat sink filler 200. Limiting portions that are touched can prevent contamination of components in drawer 105. Pressing on pressure point 222 causes hook 226 to move.

In some embodiments, frame 202 includes an extended edge 230 shown on FIG. 2B on one side and beveled edge 232 (or squared edge), as shown on FIG. 2A, on the other side. Extended edge 230 is configured to align with neighboring components (e.g., heat sink filler 200 and/or heat sink 112) such that it meshes with a beveled edge 233 on the neighboring components. The overlapping creates a full wall across drawer 105 so air can only flow through perforated sheet 204 and/or heat sink 112.

Figure 3B:
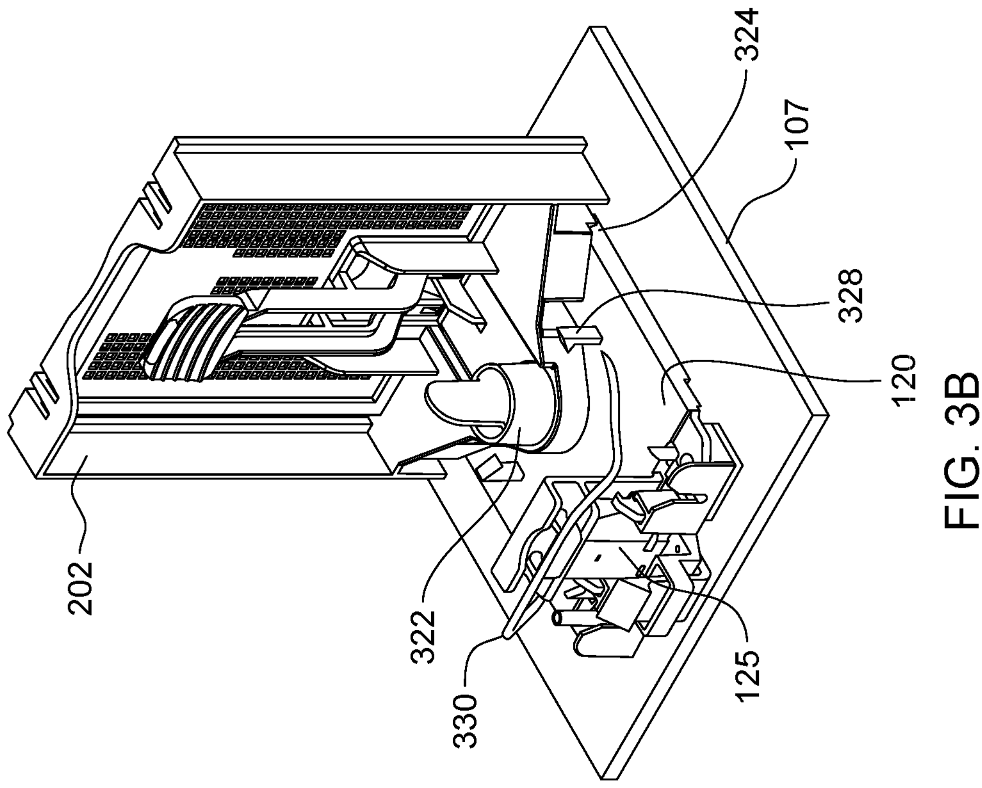
FIGS. 3A-3C are various view of a heat sink filler and a dust cover in the drawer in accordance with some embodiments of the present disclosure.
Figure 3A:
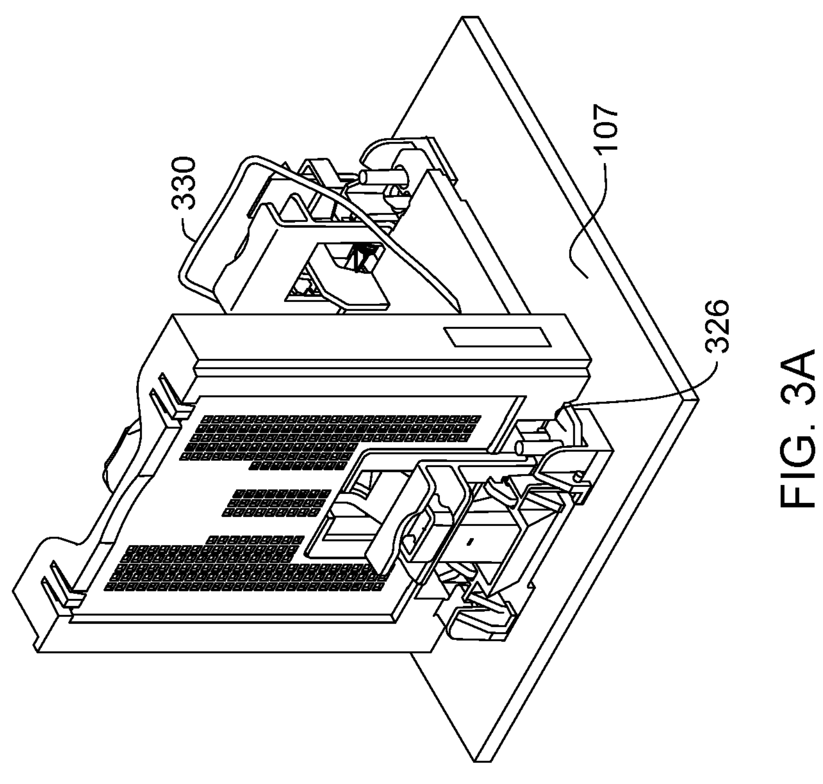
Figure 3C:
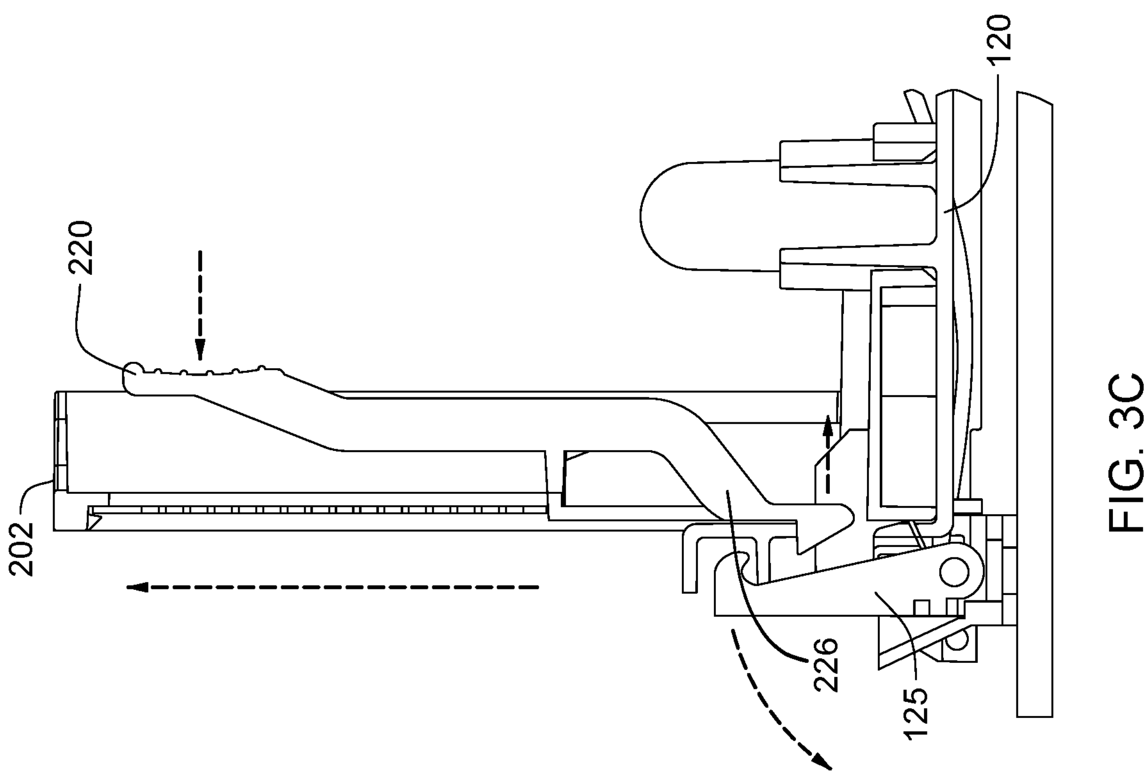

FIGS. 3A-3C show multiple views of heat sink filler 200 on dust cover 120 over a receptacle opening of drawer base 107. FIG. 3A shows asymmetrical dust cover key 326 and wire bale 330. Asymmetrical dust cover key 326 is configured to ensure dust cover 120 is inserted in the proper orientation on drawer base 107. In some embodiments, asymmetrical dust cover key 326 includes a hole, and base 107 includes a peg that allows dust cover 120 to be inserted and held in place. Keying feature 216 does not have the associated hole, which prevents it from being inserted in the wrong position. Keying feature 216, and asymmetrical dust cover key 326 all work together to ensure all components are in the proper orientation. Wire bale 330 helps to hold dust cover 120 in place on drawer base 107.

FIG. 3B shows the backside of frame 202 sitting on dust cover 120. Dust cover key 322 is a peg that fits inside keying feature 212. Dust cover key 324 is the edge of dust cover 120 and is configured to create contact with the extended portion of keying feature 224. FIG. 3B additionally shows base latch 125. Base latch 125 is part of drawer base 107 and helps to hold dust cover 120 in place over the module opening. In some embodiments, dust cover 120 includes dust cover hooks 328. Dust cover hooks 328 hold various designs of heat sink filler 200 in place on dust cover 120.

FIG. 3C is a side cutout view of heat sink filler 200 on dust cover 120. FIG. 3C shows dust cover 120 is held in place by base latch 125 and hook 226, where hook 226 is the opposite/second end of release lever 220. Compressing (or pushing) release lever 220 towards pressure point 222 disengages hook 226 from dust cover 120 so heat sink filler 200 can be pulled out of drawer 105.

Figure 4:
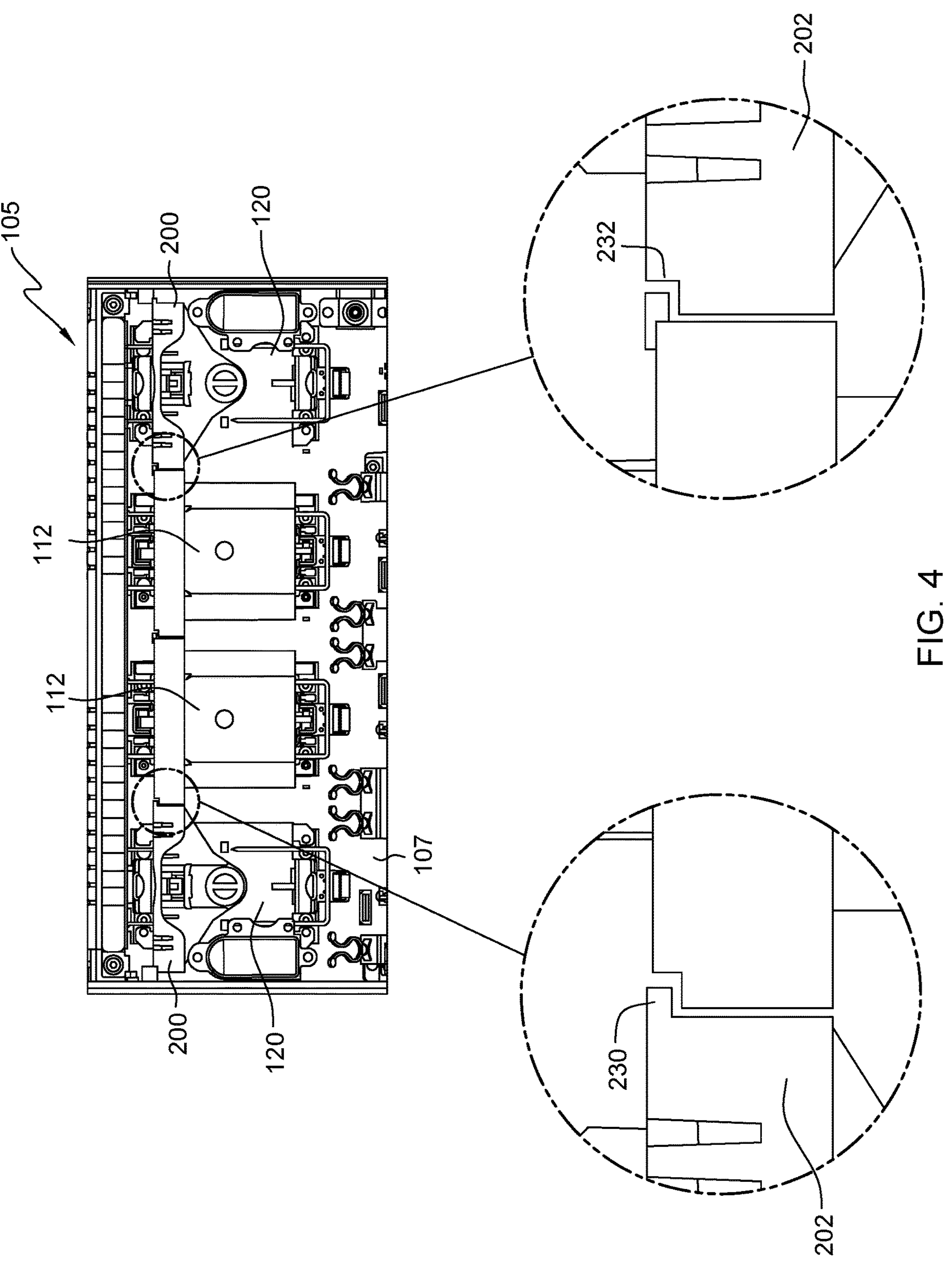
FIG. 4 is a top-down view of two heat sink fillers installed in accordance with some embodiments of the present disclosure.

FIG. 4 shows a top-down view of drawer 105. Drawer 105 has four openings with two heat sinks 112 in the middle two openings and two heat sink fillers 200 and dust plate covers 120. The interface between heat sink 112 and heat sink filler 200 is shown on both sides. It can be seen how extended edge 230 overlaps with a recess/bevel on heat sink 112. The other side shows squared edge 232 in contact with an extended edge on heat sink 112. This creates a wall across drawer 105 that ensures all (or substantially all) cooling air flow passes through heat sink 112 and heat sink filler 200. This way the design air flow is passing through the cooling components. In some embodiments, the installed heat sink filler 200 (any number) creates about equal flow through each of the installed components.

Figure 5B:
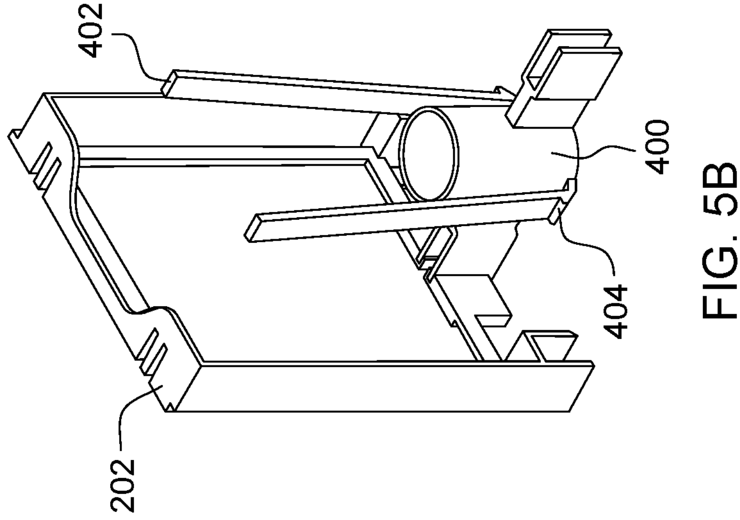
FIGS. 5A-5D are various views of two lever embodiments of a heat sink filler.
Figure 5A:
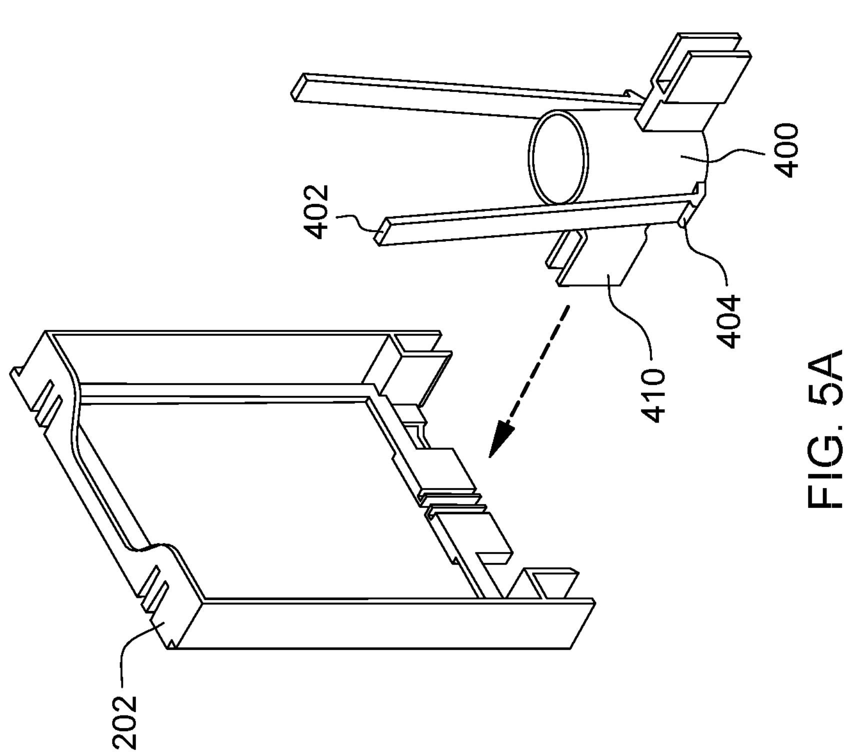
Figure 5D:
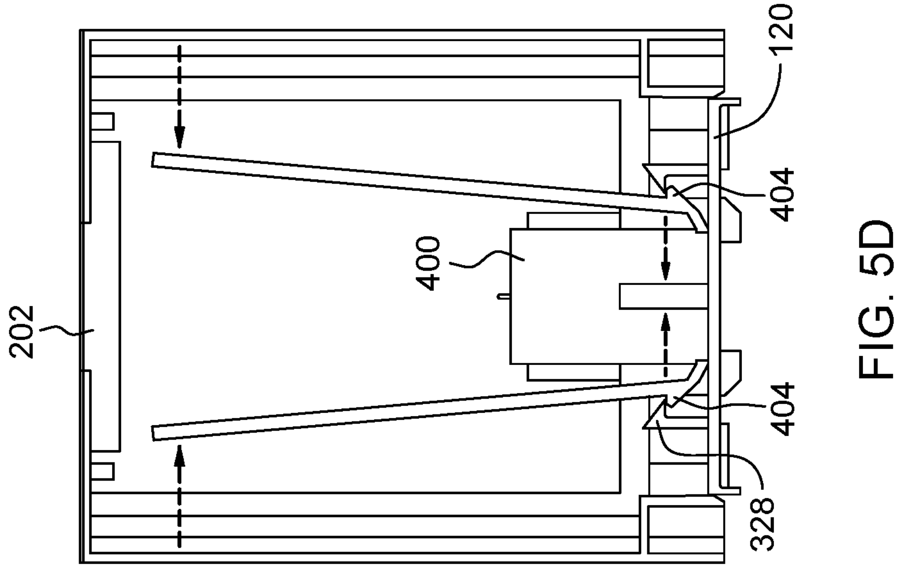
Figure 5C:
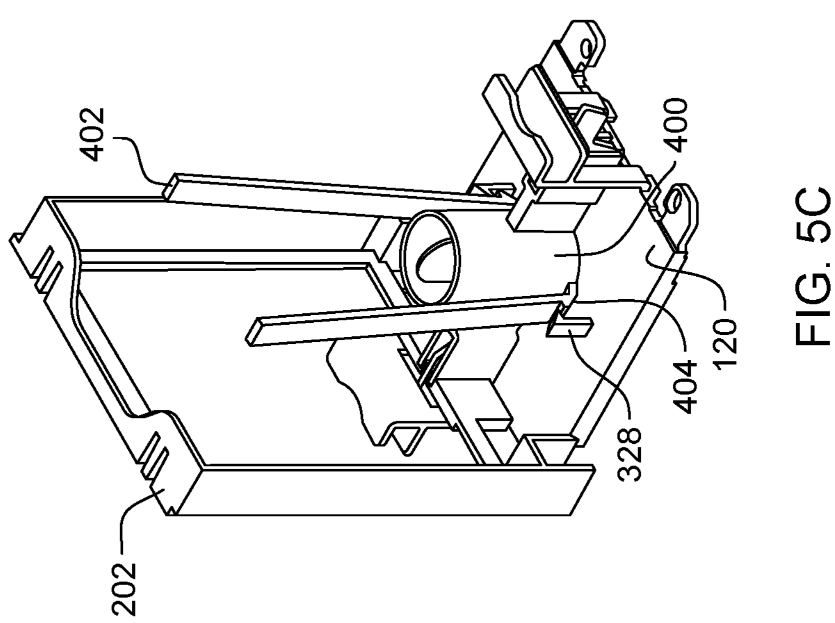

FIGS. 5A-5D show an alternative embodiment for a device to insert and remove heat sink filler 200 into drawer 105. FIG. 5A shows frame 202 and a dual lever connector 400. Dual lever connector 400 comprises levers 402, dual lever hook 404, and stabilizer 410. FIG. 5B depicts stabilizer 410 in contact with frame 202. These two components are configured to link together so both can be inserted and removed together. FIG. 5C comprises dual level connector on dust cover 120. Dual lever hook 404 engages with dust cover hook 328 to keep heat sink filler 200 in place. FIG. 5D shows an eye level, back to front view of dual level connector 400. Pushing both levers 402 allows dual lever hook 404 to disengage with dust cover hook 328 and the unit to be removed. In some embodiments, dual lever connector 400 can be factored into the impedance assessment with perforated sheet 204. The two levers 402 have a smaller surface area than release lever 220, resulting in less downstream impedance of air flow.

Figure 6B:
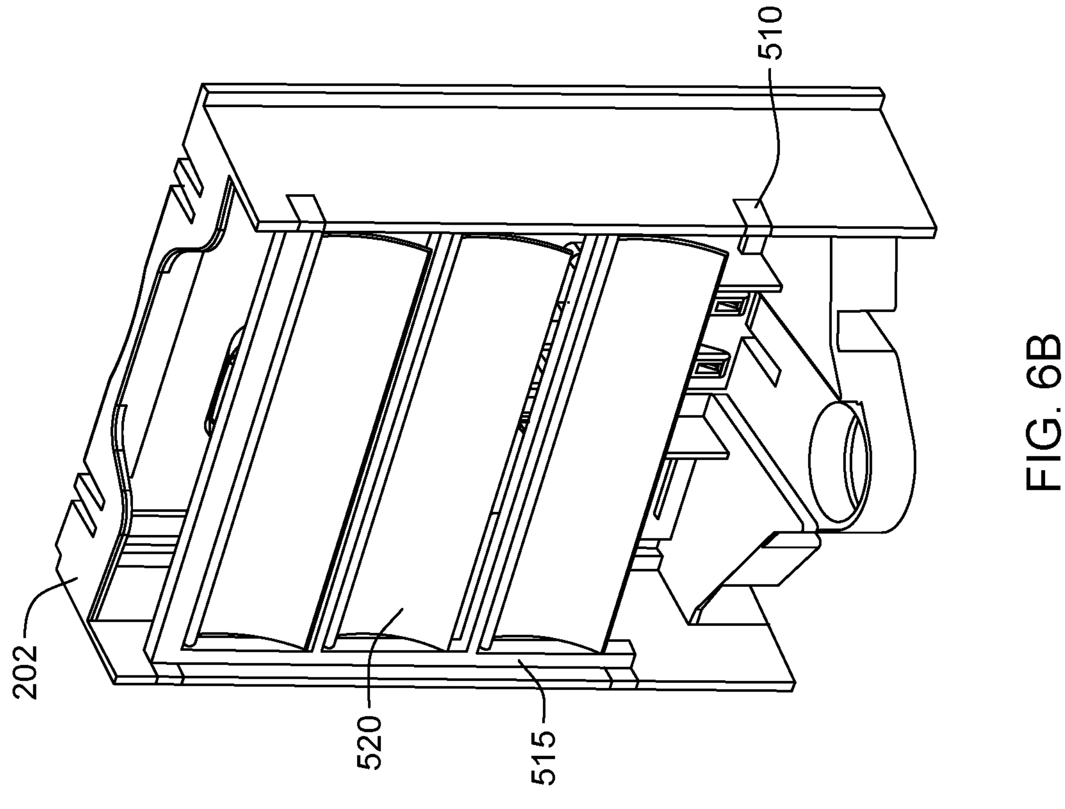
FIGS. 6A and 6B are various views of louvers attached to a heat sink filler in accordance with embodiments of the present disclosure.
Figure 6A:
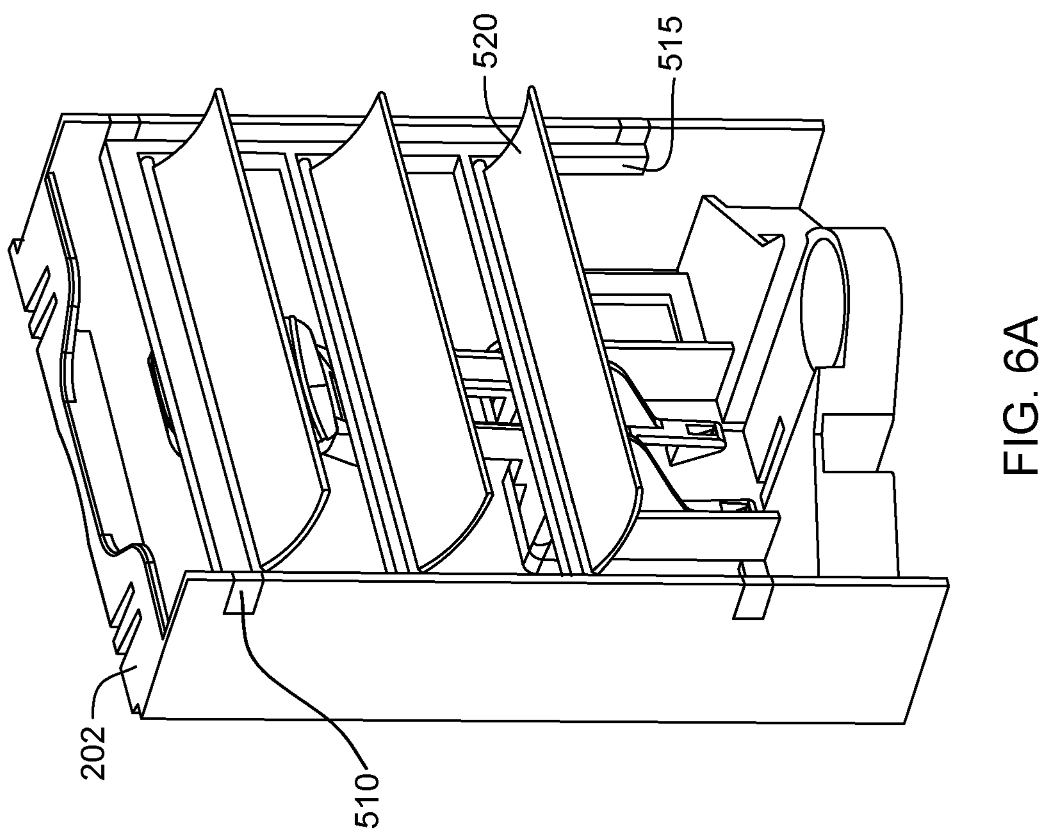

FIGS. 6A and 6B show a louvered heat sink filler. FIG. 6A includes louver bracket 510, louver mount 115, and louvers 520. Louver bracket 510 connects louver mount 215 to frame 202. Louver mount 515 allows for louver 520 to be coupled to louver mount 515. In some embodiments, the depth of frame 202 is increased to accommodate louvers 520. In some embodiments, the depth is sufficient to still use a finger to operative release lever 220 and/or lever 402 without removing louvers 520. In some embodiments, louvered heat sink filler can imitate/replicate the depth of heat sink 112. In some embodiments, the replication causes additional effect on the air flow by interacting with the air flow after passing through the set of louvers. Perforated sheet 204 ensures a designed amount of air enters the heat sink 112 and heat sink filler 200; adding louvers 520 on the end can create similar output pressure and patterns for the air flow. Thus, air flow downstream of heat sink 112 and heat sink filler 200 will be similar to design specifications when all openings have a processing unit. FIG. 6A shows louvers 520 open. The air flow causes the change in position of louvers 520. FIG. 6B shows louvers 520 with no air flow. In some embodiments, perforated sheet 204 is an inlet side for air flow and the side with keying feature 214 and/or louvers 520 are the outlet/exit for air flow.

Figure 7:
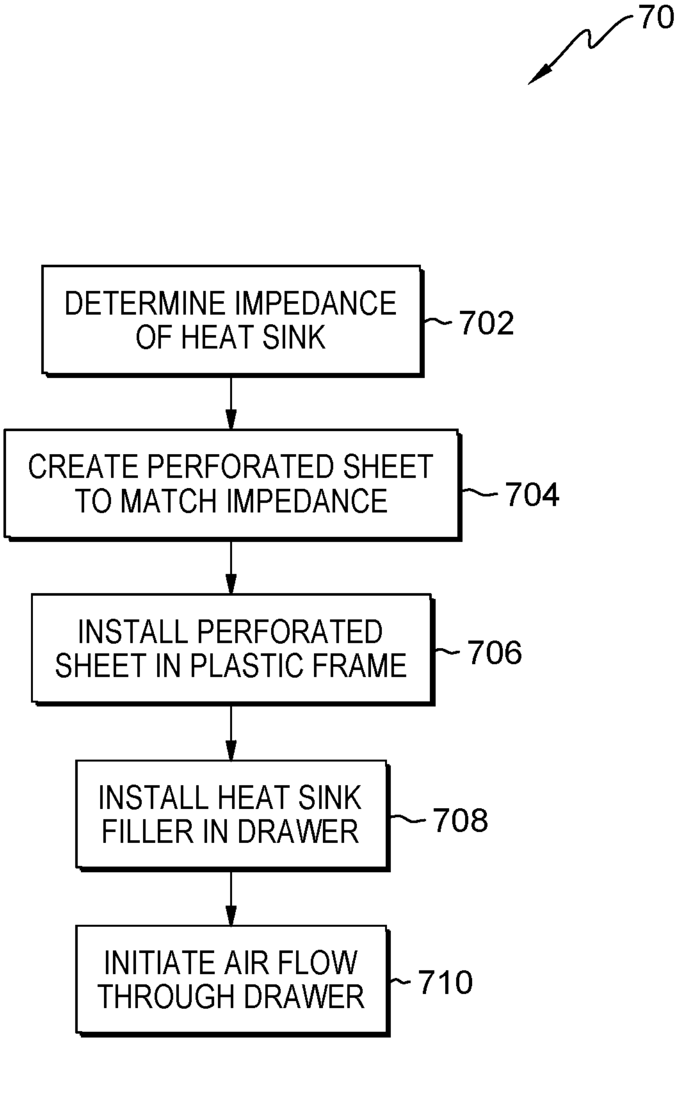
FIG. 7 is a method to install a heat sink filler in accordance with embodiments of the present disclosure.

FIG. 7 is a flowchart of example process 700 for replacing a heat sink and processing unit with a heat sink filler. One or more of the advantages and improvements described above for using a heat sink filler with a determined impedance may be realized by process 700, consistent with various embodiments of the present disclosure.

At operation 702, the impedance of the heat sink is determined. In some embodiments, operation 702 includes removing the processing unit from the drawer. At operation 704, a perforated sheet to match the determined impedance is created. At 706, the perforated sheet is inserted into frame of a heat sink filler. At operation 708, the heat sink filler with the perforated sheet is inserted in the drawer. In some embodiments, operation 708 includes installing the dust cover. In some embodiments, the dust cover is installed when the processing unit is removed. At operation 710, cooling air flow is initiated in the drawer. Because of the design of heat sink filler is configured to work with the remaining heat sinks, the amount of air flow passing through each component is similar to the design airflow when all module openings have processing units and heat sinks installed. In various embodiments, any number of the processing units can be removed and replaced. In some embodiments, the design of the heat sink filler allows for toolless insertion and removal based on the designed touch points as described above.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A heat sink filler comprising:
a frame;
a removable perforated sheet inside the frame;
a first keying feature;
an extended edge on a first edge of the frame; and
a beveled edge on a second edge of the frame, wherein the second edge is parallel to the first edge.

2. The heat sink filler of claim 1, wherein a bottom edge of the frame is configured to latch onto a dust cover, wherein the bottom edge connects the first edge and the second edge of the frame.

3. The heat sink filler of claim 2, wherein the first keying feature ensures the frame connect to the dust cover in a correct location.

4. The heat sink filler of claim 3, further comprising:
a second keying feature, wherein the second keying feature is an asymmetrical keying feature, the second keying feature interlocks with a dust cover asymmetrical keying feature, and the second keying feature ensures a correct orientation of the frame relative to the dust cover.

5. The heat sink filler of claim 1, wherein the extended edge is configured to overlap with a recessed edge of a first adjacent component.

6. The heat sink filler of claim 5, wherein the beveled edge is configured to overlap with an adjacent extended edge of a second adjacent component.

7. The heat sink filler of claim 6, wherein the extended edge and the beveled edge create a wall to prevent air passing in between the heat sink filler and the first adjacent component, and the heat sink filler and the second adjacent component.

8. The heat sink filler of claim 1, wherein the heat sink filler is configured to replace the heat sink in a server drawer.

9. The heat sink filler of claim 1, wherein the perforated sheet is an inlet side for a cooling air flow, the heat sink filler further comprising:
a set of louvers on an output side for the cooling air flow, wherein the louvers are configured to replicate a depth of the heat sink by interacting with the air flow after passing through the set of louvers.

10. The heat sink filler of claim 2, further comprising:
a release lever, wherein the release lever, when pushed towards the frame, allows the heat sink filler to be removed from the dust cover.

11. The heat sink filler of claim 2, further comprising:
a dual lever connector, wherein the dual lever connector comprises two levers that, when pushed towards each other, allow the heat sink filler to be removed from the dust cover.

* * * * *